(12) United States Patent
Odnoblyudov et al.

(10) Patent No.: US 10,655,243 B2
(45) Date of Patent: *May 19, 2020

(54) GROWTH OF EPITAXIAL GALLIUM NITRIDE MATERIAL USING A THERMALLY MATCHED SUBSTRATE

(71) Applicant: QROMIS, Inc., Santa Clara, CA (US)

(72) Inventors: Vladimir Odnoblyudov, Danville, CA (US); Cem Basceri, Los Gatos, CA (US)

(73) Assignee: QROMIS, INC., Santa Clara, CA (US)

( * ) Notice: Subject to any disclaimer, the term of this patent is extended or adjusted under 35 U.S.C. 154(b) by 98 days.

This patent is subject to a terminal disclaimer.

(21) Appl. No.: 15/667,452

(22) Filed: Aug. 2, 2017

(65) Prior Publication Data
US 2018/0038012 A1    Feb. 8, 2018

Related U.S. Application Data

(60) Provisional application No. 62/371,416, filed on Aug. 5, 2016.

(51) Int. Cl.
*H01L 21/02* (2006.01)
*C30B 25/20* (2006.01)
(Continued)

(52) U.S. Cl.
CPC .............. *C30B 25/20* (2013.01); *C30B 25/18* (2013.01); *C30B 25/183* (2013.01);
(Continued)

(58) Field of Classification Search
CPC ......... H01L 21/02458; H01L 21/02488; H01L 21/02491; H01L 21/02502; H01L 21/02505; H01L 21/02389; H01L 21/0245; H01L 21/0254; H01L 21/02496; H01L 21/02518; H01L 21/02565; H01L 21/0257; H01L 21/02595; H01L 21/02598; Y10T 428/12528; Y10T 428/12535; Y10T 428/12576; Y10T 428/12583; Y10T 428/12597; Y10T 428/12604; Y10T 428/12674; Y10T 428/12681; Y10T 428/263; Y10T 428/264; Y10T 428/265; Y10T 428/27; Y10T 428/24967; Y10T 428/2495; C30B 25/183; C30B 29/406; C30B 25/20; C30B 25/18; C30B 25/205; C30B 29/08; C30B 29/403

See application file for complete search history.

(56) References Cited

U.S. PATENT DOCUMENTS 6,328,796 B1 * 12/2001 Kub ........................ C30B 25/02
117/915
10,297,445 B2 * 5/2019 Odnoblyudov ....... C23C 16/303
(Continued)

*Primary Examiner* — Michael E. La Villa
(74) *Attorney, Agent, or Firm* — Kilpatrick Townsend & Stockton LLP

(57) ABSTRACT

An engineered substrate includes a support structure comprising a polycrystalline ceramic core, an adhesion layer coupled to the polycrystalline ceramic core, and a barrier layer coupled to the adhesion layer. The engineered substrate also includes an bonding layer coupled to the support structure, a substantially single crystal layer coupled to the bonding layer, and an epitaxial gallium nitride layer coupled to the substantially single crystal layer.

18 Claims, 8 Drawing Sheets

(51) Int. Cl.
*C30B 29/40* (2006.01)
*C30B 25/18* (2006.01)
*C30B 29/08* (2006.01)

(52) U.S. Cl.
CPC ............ *C30B 25/205* (2013.01); *C30B 29/08* (2013.01); *C30B 29/403* (2013.01); *C30B 29/406* (2013.01); *H01L 21/0245* (2013.01); *H01L 21/0254* (2013.01); *H01L 21/02389* (2013.01); *H01L 21/02458* (2013.01); *H01L 21/02488* (2013.01); *H01L 21/02491* (2013.01); *H01L 21/02502* (2013.01); *H01L 21/02505* (2013.01); *Y10T 428/12528* (2015.01); *Y10T 428/12535* (2015.01); *Y10T 428/12576* (2015.01); *Y10T 428/12583* (2015.01); *Y10T 428/12597* (2015.01); *Y10T 428/12604* (2015.01); *Y10T 428/12674* (2015.01); *Y10T 428/12681* (2015.01); *Y10T 428/2495* (2015.01); *Y10T 428/24967* (2015.01); *Y10T 428/263* (2015.01); *Y10T 428/264* (2015.01); *Y10T 428/265* (2015.01); *Y10T 428/27* (2015.01)

(56) References Cited

U.S. PATENT DOCUMENTS

2002/0096106 A1* 7/2002 Kub .................... H01L 21/2007
                                                                                117/94
2015/0311084 A1* 10/2015 Moore .............. H01L 21/28587
                                                                                257/280

* cited by examiner

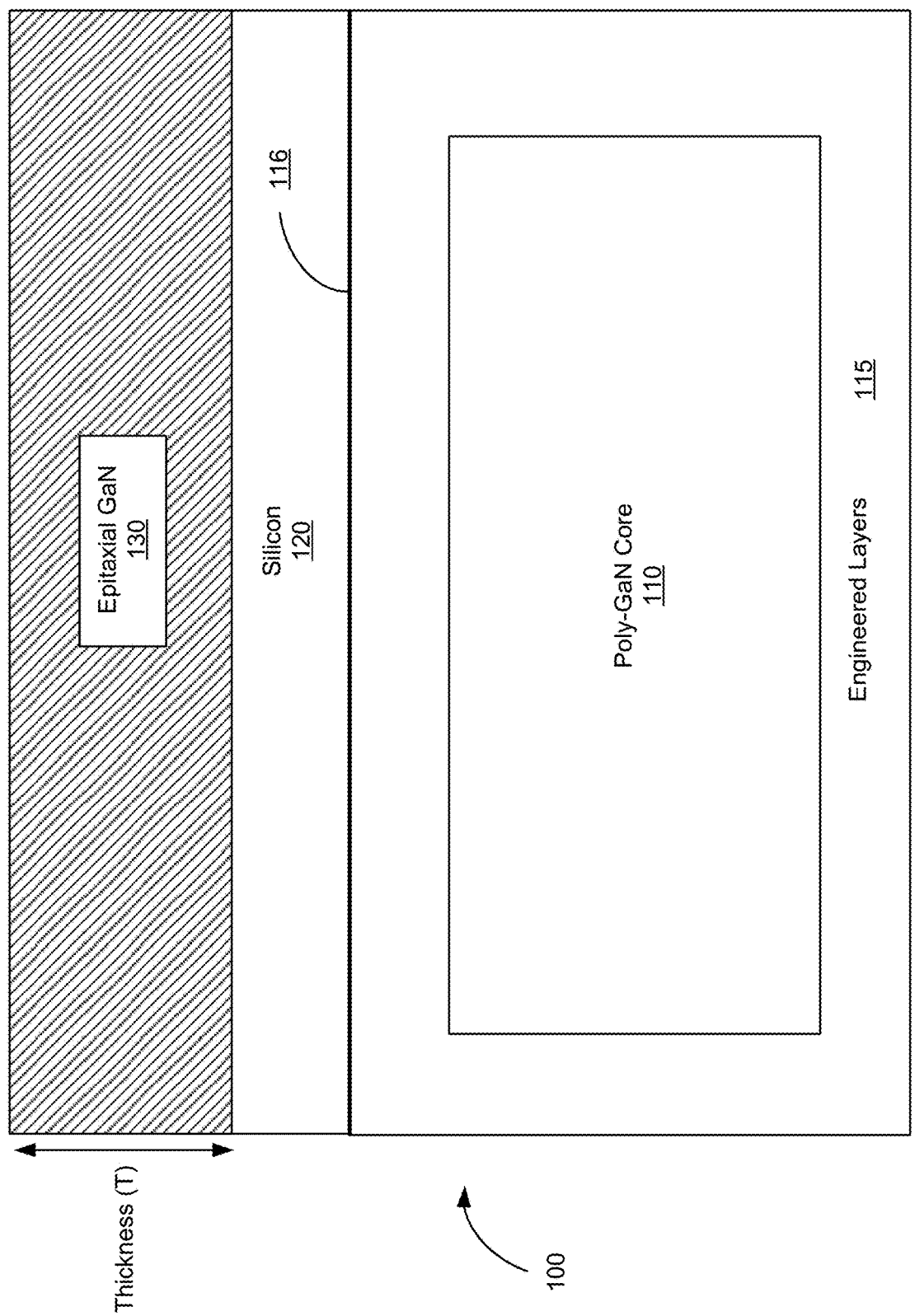

GROWTH OF EPITAXIAL GALLIUM NITRIDE MATERIAL USING A THERMALLY MATCHED SUBSTRATE

CROSS-REFERENCES TO RELATED APPLICATIONS

This application claims priority to U.S. Provisional Patent Application No. 62/371,416, filed on Aug. 5, 2016, entitled "Growth of Epitaxial Gallium Nitride Material Using a Thermally Matched Substrate," the disclosure of which is hereby incorporated by reference in its entirety for all purposes.

BACKGROUND OF THE INVENTION

Some conventional methods for the epitaxial growth of gallium nitride (GaN) layers utilize sapphire substrates. Example devices utilizing these epitaxial GaN layers are LED devices, which are used in lighting, computer monitors, and other display devices.

The growth of gallium nitride layers on a sapphire substrate is a heteroepitaxial growth process since the substrate and the epitaxial layers are composed of different materials. Due to the heteroepitaxial growth process, the epitaxially grown material can exhibit a variety of adverse effects, including reduced uniformity and reductions in metrics associated with the electronic/optical properties of the epitaxial layers. Accordingly, there is a need in the art for improved methods and systems related to epitaxial growth processes and substrate structures.

SUMMARY OF THE INVENTION

The present invention relates generally to engineered substrate structures. More specifically, the present invention relates to methods and systems suitable for use in the epitaxial growth of thick gallium nitride (GaN) layers (e.g., greater than 10 μm in thickness). Merely by way of example, the invention has been applied to a method and system that utilizes an engineered support structure that is characterized by a coefficient of thermal expansion (CTE) (e.g., a coefficient of linear thermal expansion) that is substantially matched to the thick GaN epitaxial layers grown thereon. The methods and techniques can be applied to a variety of semiconductor processing operations.

According to an embodiment of the present invention, an engineered substrate is provided. The engineered substrate structure includes a support structure comprising a polycrystalline ceramic core, an adhesion layer coupled to the polycrystalline ceramic core, and a barrier layer coupled to the adhesion layer. The engineered substrate structure also includes a bonding layer coupled to the support structure, a substantially single crystal layer coupled to the bonding layer, and an epitaxial gallium nitride layer coupled to the substantially single crystal layer.

According to another embodiment of the present invention, an engineered substrate is provided. The engineered substrate includes a support structure including a polycrystalline ceramic core, an adhesion layer coupled to the ceramic core, and a barrier layer coupled to the adhesion layer. The engineered substrate also includes an oxide layer coupled to the support structure and a single crystal layer coupled to the oxide layer.

The polycrystalline ceramic core can include polycrystalline gallium nitride, polycrystalline aluminum gallium nitride, polycrystalline aluminum nitride and one or more dopants, or combinations thereof. The one or more dopants can include at least one of titanium or titanium nitride.

According to a specific embodiment of the present invention, an epitaxial structure includes a polycrystalline ceramic core characterized by a first CTE vs. temperature profile and a plurality of engineered layers coupled to the polycrystalline ceramic core. The epitaxial structure also includes a bonding layer coupled to one or more of the plurality of engineered layers and a substantially single crystal layer coupled to the bonding layer. The epitaxial structure further includes a GaN epitaxial layer coupled to the substantially single crystal layer. The GaN epitaxial layer is characterized by a second CTE vs. temperature profile differing from the first CTE vs. temperature profile by less than 0.5 ppm/K over a temperature range of 300K to 1400K.

In an embodiment, the polycrystalline ceramic core includes at least one of polycrystalline gallium nitride, polycrystalline aluminum gallium nitride, or polycrystalline aluminum nitride and one or more dopants. The plurality of engineered layers can include an adhesion layer and a barrier layer. The substantially single crystal layer can include at least one of a single crystal silicon layer or a single crystal gallium nitride layer. In a particular embodiment, the GaN epitaxial layer is characterized by a thickness between 10 μm and 100 μm.

According to another specific embodiment of the present invention, an epitaxial structure is provided. The epitaxial structure includes a polycrystalline ceramic core characterized by a first CTE vs. temperature profile and a plurality of engineered layers coupled to the polycrystalline ceramic core. The epitaxial structure also includes a bonding layer coupled to one or more of the plurality of engineered layers and a substantially single crystal layer coupled to the bonding layer. The epitaxial structure further includes a GaN epitaxial layer coupled to the substantially single crystal layer. The GaN epitaxial layer is characterized by a second CTE vs. temperature profile differing from the first CTE vs. temperature profile by less than 10% over a temperature range of 300K to 1400K.

The GaN epitaxial layer can be characterized by a second CTE vs. temperature profile differing from the first CTE vs. temperature profile by less than 5% over a temperature range of 300K to 1400K. Additionally, the GaN epitaxial layer can be characterized by a second CTE vs. temperature profile differing from the first CTE vs. temperature profile by less than 5% over a temperature range of 700K to 1400K and by less than 4% over a temperature range of 300K to 700K.

Numerous benefits are achieved by way of the present invention over conventional techniques. For example, embodiments of the present invention provide for the epitaxial growth of thick GaN layers (e.g., 10-100 μm in thickness) that are substantially free of cracks and peeling. Such thick, low dislocation layers can be a foundation for a wide variety of applications, starting with vertical power device architectures, low dislocation layers for laser applications, wide-bandgap integrated circuits, or large diameter (6-inch, 8-inch, 12-inch and beyond) free-standing GaN wafers. These and other embodiments of the invention along with many of its advantages and features are described in more detail in conjunction with the text below and attached figures.

BRIEF DESCRIPTION OF THE DRAWINGS

FIG. 1A is a simplified schematic diagram illustrating an engineered substrate structure including a polycrystalline GaN core according to an embodiment of the present invention.

DETAILED DESCRIPTION OF SPECIFIC EMBODIMENTS

Embodiments of the present invention relate to engineered substrate structures. More specifically, the present invention relates to methods and systems suitable for use in the epitaxial growth of thick gallium nitride (GaN) layers (e.g., greater than 10 μm in thickness). Merely by way of example, the invention has been applied to a method and system that utilizes an engineered support structure that is characterized by a coefficient of thermal expansion (CTE) that is substantially matched to the thick GaN epitaxial layers grown thereon. The methods and techniques can be applied to a variety of semiconductor processing operations.

Figure 5:
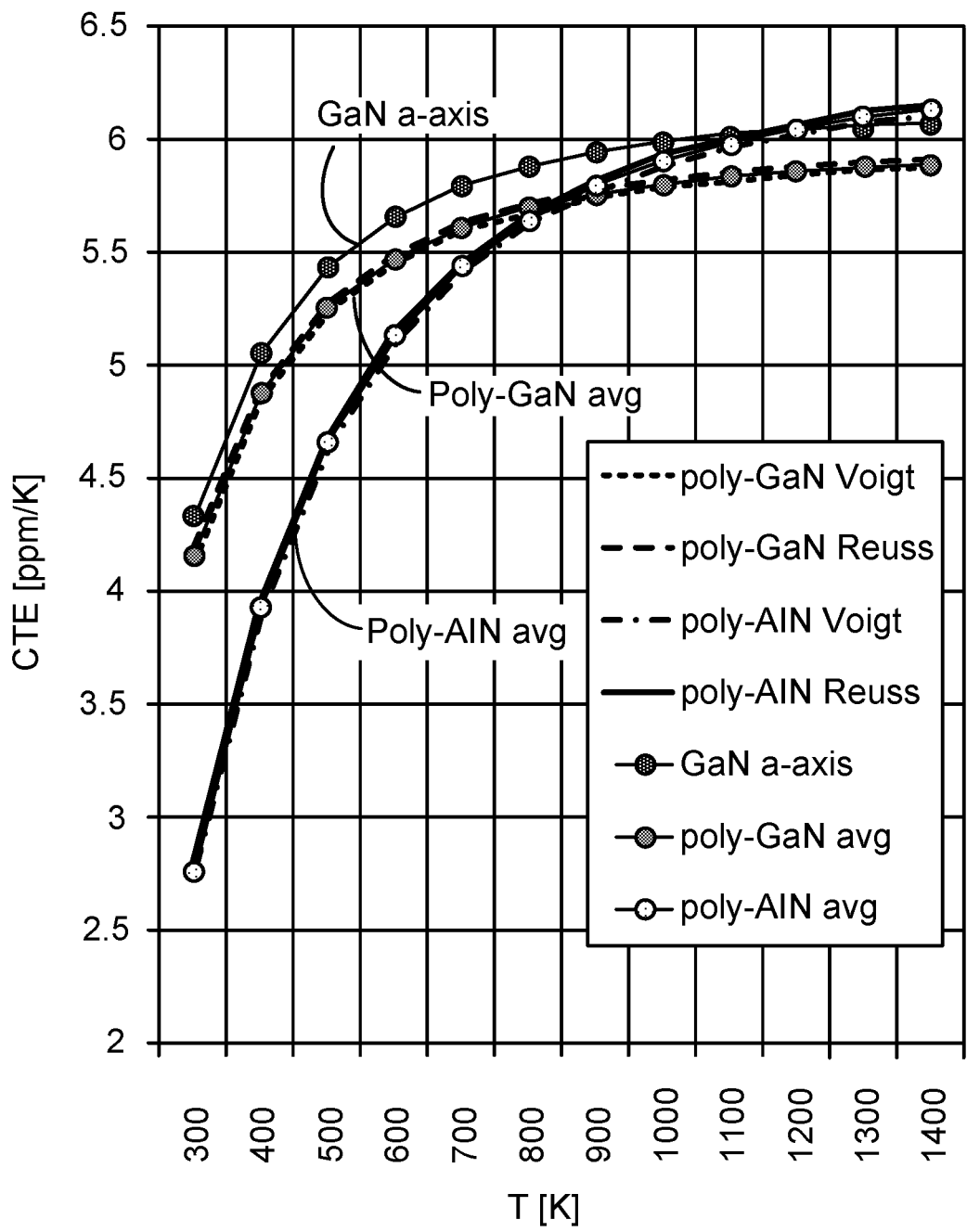
FIG. 5 is a plot illustrating coefficients of thermal expansion as a function of temperature for various materials.

FIG. 5 is a plot illustrating coefficients of thermal expansion as a function of temperature for various materials. In an engineered substrate utilizing an aluminum nitride (AlN) ceramic core surrounded by engineered layers, the thermal mismatch between the ceramic core and the epitaxially grown GaN material can result in cracking and peeling of the epitaxially grown GaN material after the completion of the growth process.

Referring to FIG. 5, at temperatures approximately equal to growth temperatures (e.g., temperatures in the range of 1,000° C.), the CTE of the polycrystalline AlN is substantially matched to the CTE of the epitaxially grown GaN. However, the inventors have determined that after thick GaN layers are grown (e.g., greater than 10 μm in thickness), the CTE mismatch during cooling of the post-growth structure, particularly in the temperature range from about 300° C. (i.e., 573K) to room temperature (i.e., 300K) as illustrated in FIG. 5, may result in cracking and/or peeling of the epitaxially grown GaN layer.

Accordingly, as described herein, embodiments of the present invention utilize a polycrystalline ceramic core that is substantially CTE matched to the epitaxially grown GaN layer over a substantial temperature range, both including at growth temperatures, as well as at post-growth cool down temperatures. The CTE matching between the substrate structure and the epitaxial layer reduces the level of post-growth cool down stress (for example, by a factor greater than two) at temperatures in the range of room temperature to several hundred degrees Celsius, enabling the growth of GaN layers much thicker than available using conventional techniques. As an example, embodiments of the present invention enable the growth of GaN layers up to and exceeding 100 μm in thickness.

FIG. 1A is a simplified schematic diagram illustrating an engineered substrate structure including a polycrystalline GaN core according to an embodiment of the present invention. The engineered substrate structure 100 has a polycrystalline ceramic core including polycrystalline GaN 110, which has substantially the same CTE properties of the GaN epitaxial layer 130. The thickness of the core can be on the order of 100 to 1,500 μm, for example, 725 μm. Referring to FIG. 5, polycrystalline GaN has a CTE vs. temperature profile that closely matches the CTE vs. temperature profile of crystalline GaN.

As illustrated in FIG. 5, the CTE for GaN grown on the a-axis ranges from ~4.4 ppm/K at 300K to ~6.1 ppm/K at 1400K. The CTE for poly-GaN ranges from ~4.2 ppm/K at 300K to ~5.8 ppm/K at 1400K. The difference between the CTE values for GaN a-axis and poly-GaN is substantially constant and equal to ~0.3 ppm/K over temperatures from 700K to 1400K. As the temperature drops from 700K to 300K, the CTE difference decreases to ~0.2 ppm/K. Thus, GaN a-axis and poly-GaN are characterized by a CTE difference of about 4% for the temperature range from 300K to 700K and about 5% for the temperature range from 700K to 1400K.

In contrast with the poly-GaN CTE values, although the CTE of the poly-AlN and the GaN a-axis are substantially identical at 1400K (i.e., CTE for GaN a-axis of ~6.1 ppm/K at 1400K and CTE for poly-AlN of ~6.2 ppm/K at 1400K), the CTE values differ significantly at 300K (i.e., CTE for GaN a-axis of ~4.4 ppm/K at 300K and CTE for poly-AlN of ~2.8 ppm/K at 3400K). The difference between the CTE values for GaN a-axis and poly-AlN is substantially less than 0.1 ppm/K over temperatures from 1000K to 1400K. As the temperature drops from 1000K to 300K, the CTE difference increases to ~1.6 ppm/K. Thus, although GaN a-axis and poly-AlN are characterized by a negligible CTE difference (~0.1 ppm/K/~6 ppm/K=~2%) for the temperature range from 1000 to 1400K, the CTE difference is significant as the temperature decreases to room temperature (i.e., from ~0.2 ppm/K/~6 ppm/K=~3% at 900K to ~1.6 ppm/K/~4 ppm/K=~40% at 300K).

Accordingly, embodiments of the present invention that utilize poly-GaN cores can be characterized by a CTE difference between the polycrystalline ceramic core and the epitaxial GaN material of less than 40% over the temperature range from growth temperatures to room temperature. In an embodiment, the CTE difference between the polycrystalline ceramic core and the epitaxial GaN material is less than 10% over the temperature range from 300K to 1400K. In another embodiment, the CTE difference between the polycrystalline ceramic core and the epitaxial GaN material growth is less than 5% over the temperature range from 300K to 1400K. temperatures to room temperature. In yet another embodiment, the CTE difference between the polycrystalline ceramic core and the epitaxial GaN material growth is about 5% over a given temperature range including epitaxial growth temperatures (i.e., 700K to 1400K) and about 4% over a given temperature range including room temperature and post-growth cool down processes (300K to 700K).

In some embodiments, rather than utilizing percentages to compare the CTE profiles of the polycrystalline ceramic core and the epitacially grown GaN, the CTE of the polycrystalline ceramic core can be within a predetermined value, for example, 0.5 ppm/K or even 0.25 ppm/K, of the epitaxially grown (e.g., single crystal) GaN over a predetermined temperature range, for example, from 300K-1400K or from 300K to 1200 K.

One or more engineered layers 115 are deposited on the polycrystalline ceramic core including GaN 110. Additional description related to the engineered layers 115 is provided below in relation to FIG. 4.

A substantially single crystal silicon layer 120 is joined to the top surface 116 of the engineered layers 115. The substantially single crystal silicon layer 120 is suitable for use as a growth layer during an epitaxial growth process for the formation of epitaxial GaN layer 130. In some embodiments, the epitaxial GaN layer 130 has a thickness (T) ranging from about 10 μm to 100 μm, which can be utilized as one of a plurality of layers utilized in optoelectronic or power devices. In an embodiment, the substantially single crystal silicon layer 120 includes a single crystal silicon layer that is attached to the top surface 116 of the engineered layers 115 using a layer transfer process. As discussed above, the close CTE match between the polycrystalline ceramic core including GaN 110 and the epitaxial GaN layer 130 enables the epitaxial GaN layer to maintain suitable material properties after completion of the growth and cool down processes.

Figure 1B:
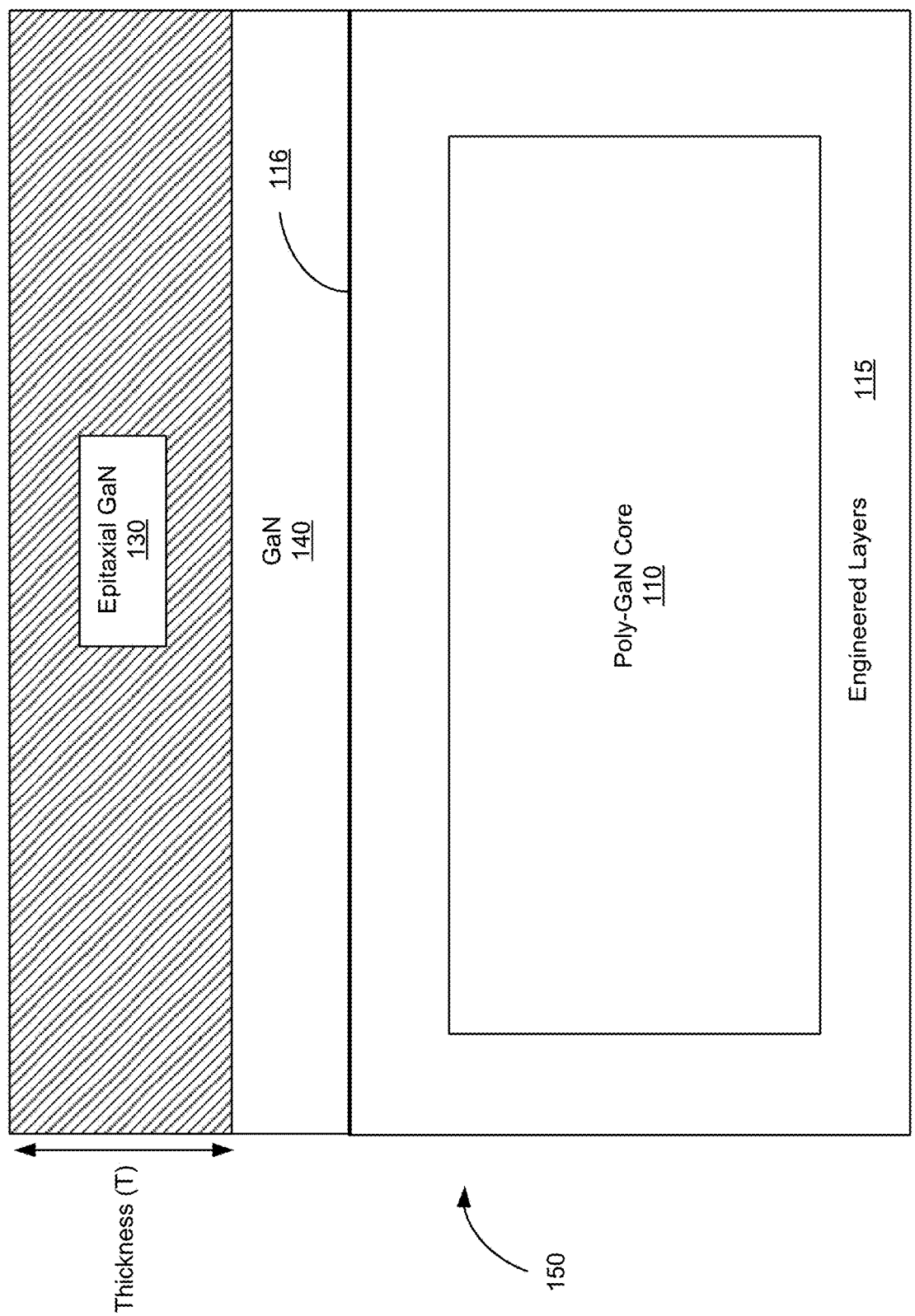
FIG. 1B is a simplified schematic diagram illustrating an engineered substrate structure including a polycrystalline GaN core according to another embodiment of the present invention.

FIG. 1B is a simplified schematic diagram illustrating an engineered substrate structure including a polycrystalline GaN core according to another embodiment of the present invention. The engineered substrate structure illustrated in FIG. 1B shares some similarities with the engineered substrate structure illustrated in FIG. 1A and description provided in relation to FIG. 1A is applicable to FIG. 1B as appropriate.

In FIG. 1B, a substantially single crystal GaN layer 140 is joined to the top surface 116 of the engineered layers 115. The substantially single crystal GaN layer 140 is suitable for use as a growth layer during an epitaxial growth process for the formation of epitaxial GaN layer 130. In an embodiment, the substantially single crystal GaN layer 140 includes a single crystal GaN layer that is attached to the top surface 116 of the engineered layers 115 using a layer transfer process. As illustrated in FIG. 1B, homoepitaxial growth of epitaxial GaN layer 130 on the substantially single crystal GaN layer 140 is provided by embodiments of the present invention.

Figure 2A:
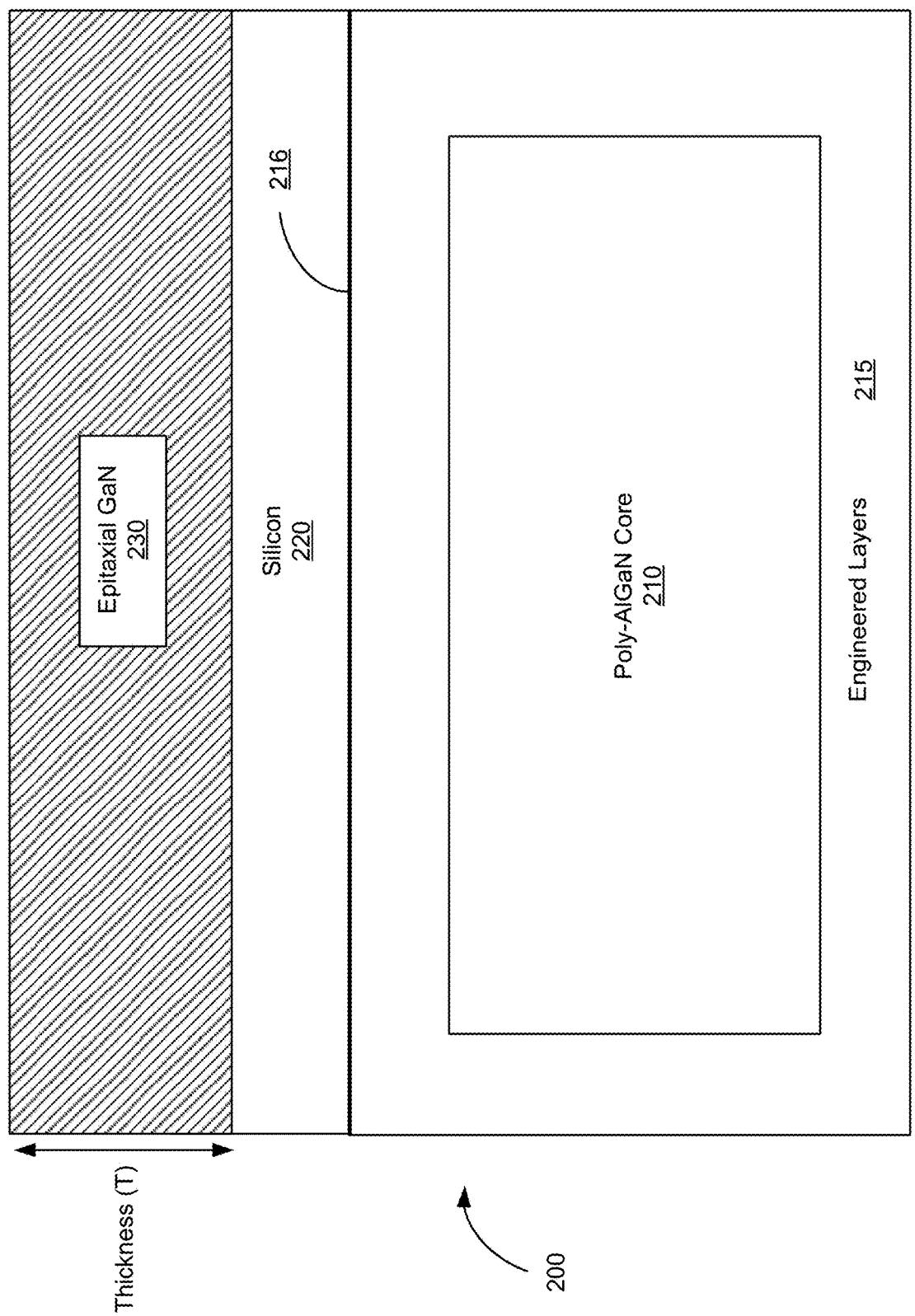
FIG. 2A is a simplified schematic diagram illustrating an engineered substrate structure including a polycrystalline AlGaN core according to an embodiment of the present invention.

FIG. 2A is a simplified schematic diagram illustrating an engineered substrate structure including a polycrystalline AlGaN core according to an embodiment of the present invention. In order to make the polycrystalline ceramic core including AlGaN 210, grains of polycrystalline AlN and polycrystalline GaN are mixed together in a predetermined proportion and fired to create the poly AlGaN core. In some embodiments, the mole fraction of $Al_xGa_yN$ ranges from 0<x<100% and 0<y<100%, including boundary cases of polycrystalline AlN and GaN. In a set of particular embodiments, the mole fractions are $Al_{0.8}Ga_{0.2}N$ or $Al_{0.5}Ga_{0.5}N$ although the present invention is not limited to these particular mole fractions. As an example, in other embodiments, sintering agent can be used (e.g., yttria, or $Y_2O_3$) to support ceramic formation. Yttria concentration can be in the range of 0<z<10%, resulting in the formation of $Al_xGa_yN(Y_2O_3)_z$), so that $Al_xGa_yN$ content is between 90% and 100% of the compound. One of ordinary skill in the art would recognize many variations, modifications, and alternatives.

One or more engineered layers 215 are deposited on the polycrystalline ceramic core including AlGaN 210. Additional description related to the engineered layers 215 is provided below in relation to FIG. 4.

A substantially single crystal silicon layer 220 is joined to the top surface 216 of the engineered layers 215. The substantially single crystal silicon layer 220 is suitable for use as a growth layer during an epitaxial growth process for the formation of epitaxial GaN layer 230. In some embodiments, the epitaxial GaN layer 230 has a thickness (T) ranging from about 10 μm to 100 μm, which can be utilized as one of a plurality of layers utilized in optoelectronic or power devices. In an embodiment, the substantially single crystal silicon layer 220 includes a single crystal silicon layer that is attached to the top surface 216 of the engineered layers 215 using a layer transfer process. As discussed above, the close CTE match between the polycrystalline ceramic core including AlGaN 210 and the epitaxial GaN layer 230 enables the epitaxial GaN layer to maintain suitable material properties after completion of the growth and cool down processes.

Figure 2B:
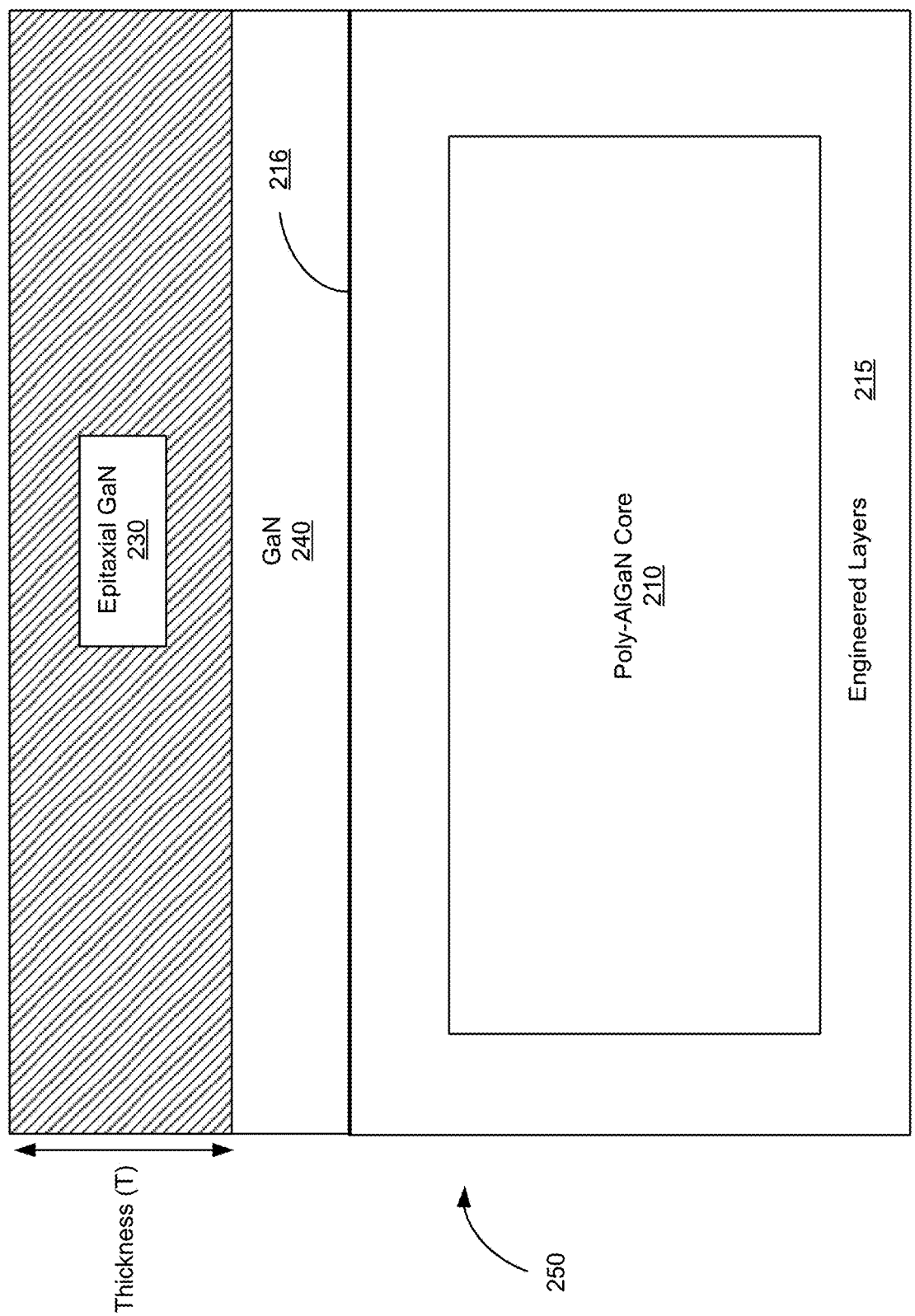
FIG. 2B is a simplified schematic diagram illustrating an engineered substrate structure including a polycrystalline AlGaN core according to another embodiment of the present invention.

FIG. 2B is a simplified schematic diagram illustrating an engineered substrate structure including a polycrystalline AlGaN core according to another embodiment of the present invention. The engineered substrate structure illustrated in FIG. 2B shares some similarities with the engineered substrate structure illustrated in FIG. 2A and description provided in relation to FIG. 2A is applicable to FIG. 2B as appropriate.

In FIG. 2B, a substantially single crystal GaN layer 240 is joined to the top surface 216 of the engineered layers 215. The substantially single crystal GaN layer 240 is suitable for use as a growth layer during an epitaxial growth process for the formation of epitaxial GaN layer 230. In an embodiment, the substantially single crystal GaN layer 240 includes a single crystal GaN layer that is attached to the top surface 216 of the engineered layers 215 using a layer transfer process. As illustrated in FIG. 2B, homoepitaxial growth of epitaxial GaN layer 230 on the substantially single crystal GaN layer 240 is provided by embodiments of the present invention.

Figure 3A:
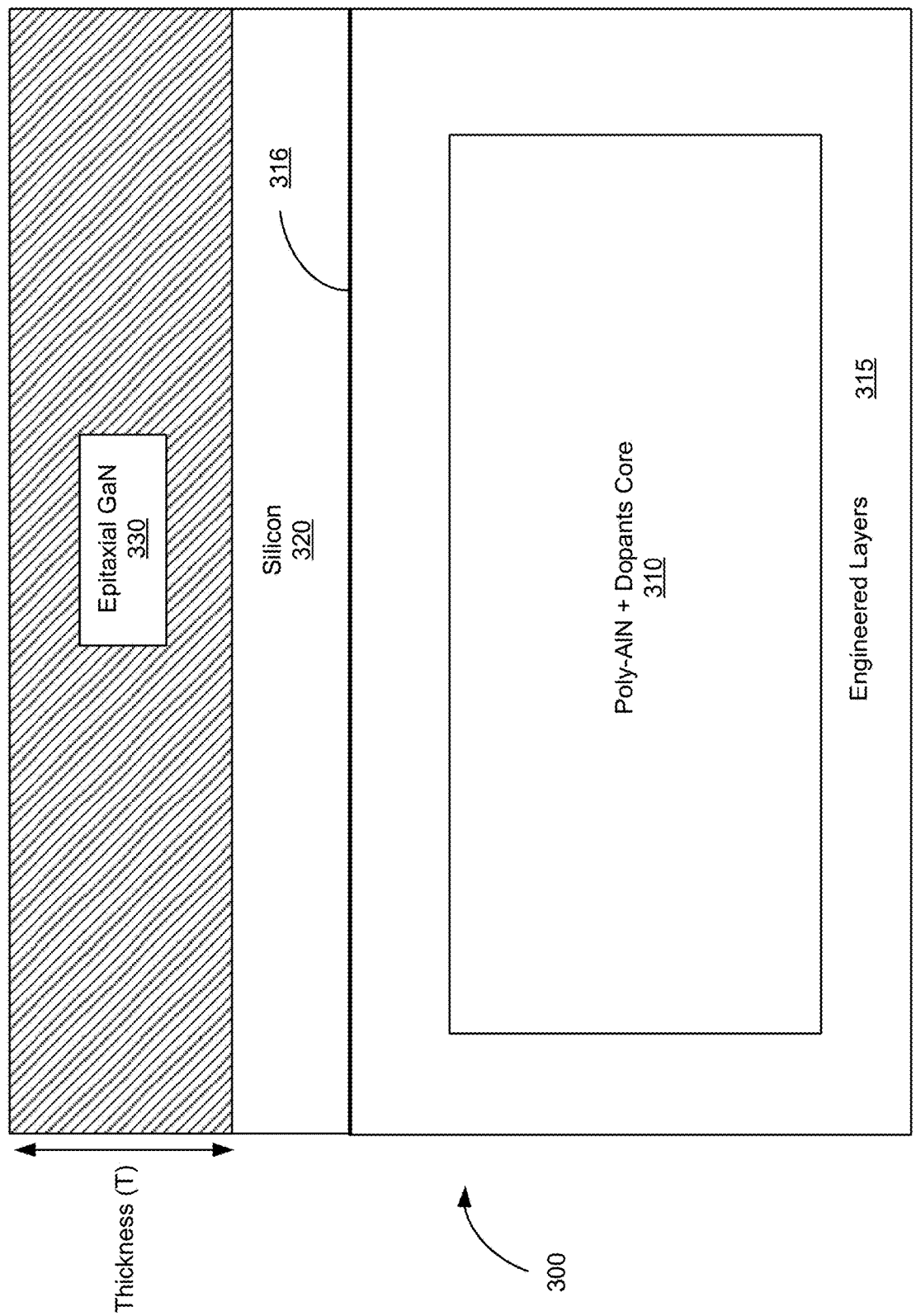
FIG. 3A is a simplified schematic diagram illustrating an engineered substrate structure including a polycrystalline AlN core with dopants according to an embodiment of the present invention.

FIG. 3A is a simplified schematic diagram illustrating an engineered substrate structure including a polycrystalline AlN core with dopants according to an embodiment of the present invention. The dopants that are utilized in the polycrystalline core can include titanium (Ti), titanium nitride (TiN), and the like. These dopants modify the CTE vs. temperature profile of the polycrystalline core such that the profile closely matches the profile of the epitaxial GaN layer 330.

One or more engineered layers 315 are deposited on the polycrystalline ceramic core including AlN and dopants 310. Additional description related to the engineered layers 315 is provided below in relation to FIG. 4.

A substantially single crystal silicon layer 320 is joined to the top surface 316 of the engineered layers 315. The substantially single crystal silicon layer 320 is suitable for use as a growth layer during an epitaxial growth process for the formation of epitaxial GaN layer 330. In some embodiments, the epitaxial GaN layer 330 has a thickness (T) ranging from about 10 μm to 100 μm, which can be utilized as one of a plurality of layers utilized in optoelectronic or power devices. In an embodiment, the substantially single crystal silicon layer 320 includes a single crystal silicon layer that is attached to the top surface 316 of the engineered layers 315 using a layer transfer process. As discussed above, the close CTE match between the polycrystalline ceramic core including AlN and dopants 310 and the epitaxial GaN layer 330 enables the epitaxial GaN layer to maintain suitable material properties after completion of the growth and cool down processes.

Figure 3B:
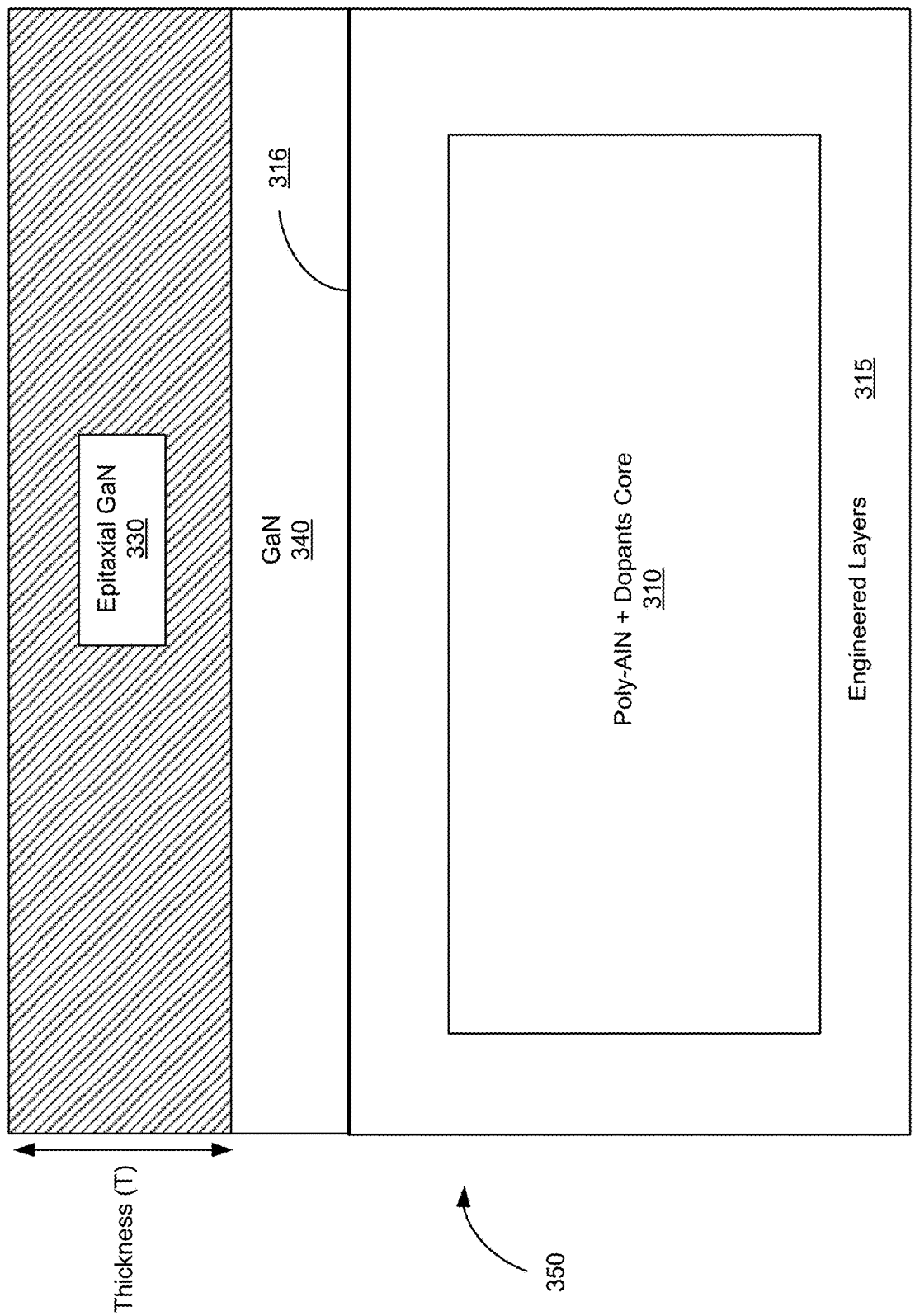
FIG. 3B is a simplified schematic diagram illustrating an engineered substrate structure including a polycrystalline AlN core with dopants according to another embodiment of the present invention.

FIG. 3B is a simplified schematic diagram illustrating an engineered substrate structure including a polycrystalline AlN core with dopants according to another embodiment of the present invention. The engineered substrate structure illustrated in FIG. 3B shares some similarities with the engineered substrate structure illustrated in FIG. 3A and description provided in relation to FIG. 3A is applicable to FIG. 3B as appropriate.

In FIG. 3B, a substantially single crystal GaN layer 340 is joined to the top surface 316 of the engineered layers 315. The substantially single crystal GaN layer 340 is suitable for use as a growth layer during an epitaxial growth process for the formation of epitaxial GaN layer 330. In an embodiment, the substantially single crystal GaN layer 340 includes a single crystal GaN layer that is attached to the top surface 316 of the engineered layers 315 using a layer transfer process. As illustrated in FIG. 3B, homoepitaxial growth of epitaxial GaN layer 330 on the substantially single crystal GaN layer 340 is provided by embodiments of the present invention.

Figure 4:
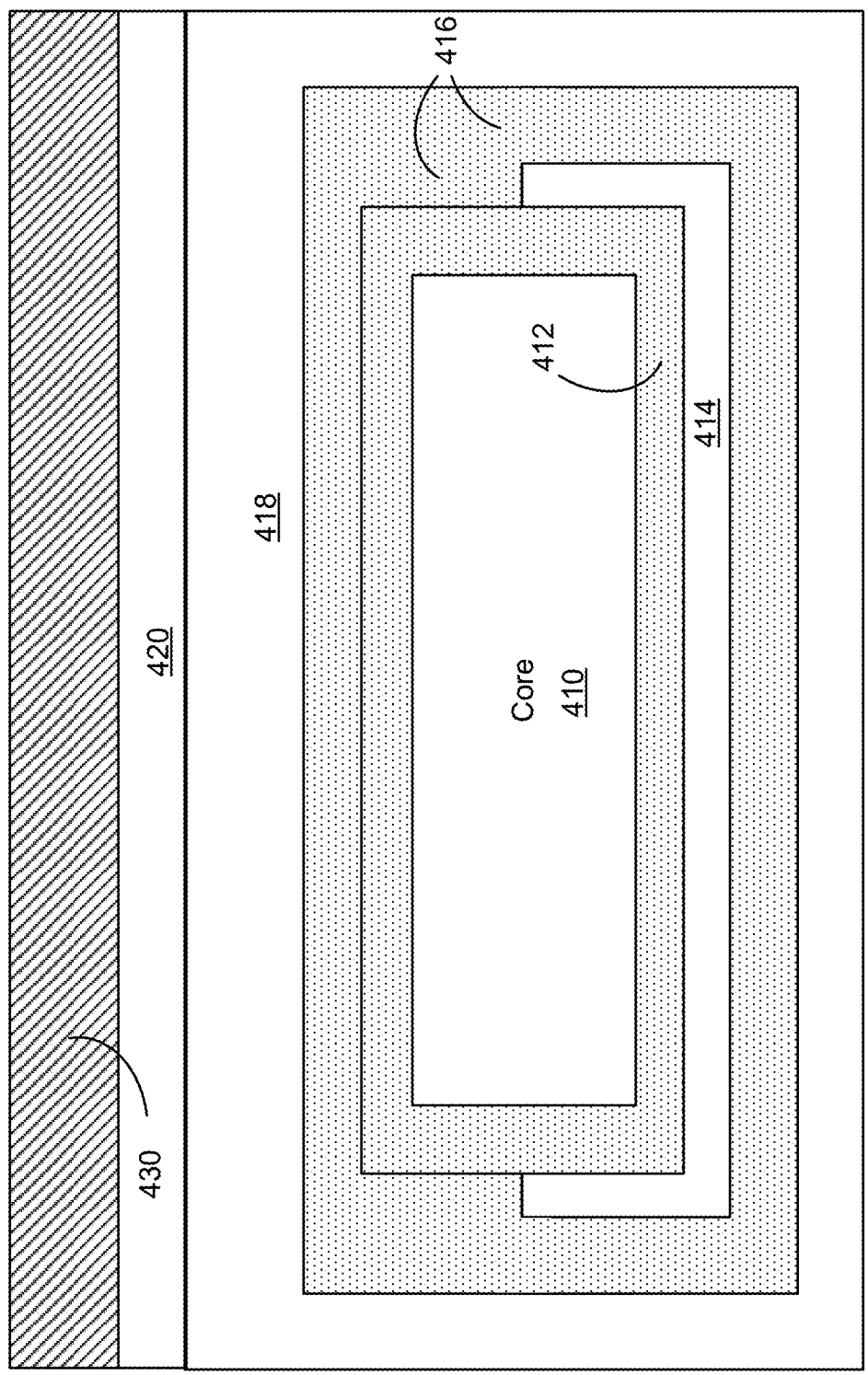
FIG. 4 is a simplified schematic diagram illustrating engineered layers of an engineered substrate structure according to another embodiment of the present invention.

FIG. 4 is a simplified schematic diagram illustrating engineered layers of an engineered substrate structure according to another embodiment of the present invention. The engineered substrate structure illustrated in FIG. 4 can be utilized to as a growth substrate for the thick GaN epitaxial layers illustrated in FIGS. 1A through 3B. One of ordinary skill in the art would recognize many variations, modifications, and alternatives.

Referring to FIG. 4, a polycrystalline ceramic core 410 is provided. The polycrystalline ceramic core 410 can include the CTE-matched materials discussed above, including polycrystalline GaN, polycrystalline AlGaN, polycrystalline AlN with dopants, or the like. The polycrystalline ceramic core 410 is encapsulated in an adhesion layer 412 that can be referred to as a shell or an encapsulating shell. In an embodiment, the adhesion layer 412 comprises a tetraethyl orthosilicate (TEOS) oxide layer on the order of 1,000 Å in thickness. In other embodiments, the thickness of the adhesion layer varies, for example, from 100 Å to 2,000 Å. Although TEOS oxides are utilized for adhesion layers in some embodiments, other materials that provide for adhesion between later deposited layers and underlying layers or materials (e.g., ceramics, in particular, polycrystalline ceramics) can be utilized according to an embodiment of the present invention. For example, $SiO_2$ or other silicon oxides ($Si_xO_y$) adhere well to ceramic materials and provide a suitable surface for subsequent deposition, for example, of conductive materials. The adhesion layer 412 completely surrounds the polycrystalline ceramic core 410 in some embodiments to form a fully encapsulated core and can be formed using an LPCVD process. The adhesion layer provides a surface on which subsequent layers adhere to form elements of the engineered substrate structure.

In addition to the use of LPCVD processes, furnace-based processes, and the like to form the encapsulating adhesion layer, other semiconductor processes can be utilized according to embodiments of the present invention, including CVD processes or similar deposition processes. As an example, a deposition process that coats a portion of the core can be utilized, the core can be flipped over, and the deposition process could be repeated to coat additional portions of the core. Thus, although LPCVD techniques are utilized in some embodiments to provide a fully encapsulated structure, other film formation techniques can be utilized depending on the particular application.

A conductive layer 414 is formed adjacent the adhesion layer 412. In the illustrated embodiment, the conductive material is be formed on a portion of the adhesion layer, for example, a lower half of the substrate structure. In some embodiments, conductive material can be formed as a fully encapsulating layer and subsequently removed on one side of the substrate structure. The conductive layer 414 can be polysilicon (i.e., polycrystalline silicon) with a thickness on the order of 500-5,000 Å, for example, 2,500 Å.

In an embodiment, the conductive layer 414 can be a polysilicon doped to provide a highly conductive material, for example, doped with boron to provide a p-type polysilicon layer. In some embodiments, the doping with boron is at a level of $1 \times 10^{19}$ cm$^{-3}$ to $1 \times 10^{20}$ cm$^{-3}$ to provide for high conductivity. Other dopants at different dopant concentrations (e.g., phosphorus, arsenic, bismuth, or the like at dopant concentrations ranging from $1 \times 10^{16}$ cm$^{-3}$ to $5 \times 10^{18}$ cm$^{-3}$) can be utilized to provide either n-type or p-type semiconductor materials suitable for use in the conductive layer. One of ordinary skill in the art would recognize many variations, modifications, and alternatives.

The presence of the conductive layer 414 is useful during electrostatic chucking of the engineered substrate to semiconductor processing tools, for example tools with electrostatic discharge (ESD) chucks. The conductive layer enables rapid dechucking after processing in the semiconductor processing tools. Thus, embodiments of the present invention provide substrate structures that can be processed in manners utilized with conventional silicon wafers. One of ordinary skill in the art would recognize many variations, modifications, and alternatives.

A second adhesion layer 416 (e.g., a TEOS oxide layer on the order of 1,000 Å in thickness) is formed surrounding the conductive layer 414. The second adhesion layer 416 completely surrounds the conductive layer 414 in some embodiments to form a fully encapsulated structure and can be formed using an LPCVD process, a CVD process, or any other suitable deposition process, including the deposition of a spin-on dielectric.

In the embodiment illustrated in FIG. 4, the conductive layer 414 is only present on the lower half of the substrate structure. The inventors have determined that in some cases, peeling of the epitaxial GaN layer can result from poor adhesion at the interface with the conductive layer. As a result, by placing the adhesion layer only on the lower portion of the structure, the adhesion of the layers on the upper portion of the structure, particularly, the epitaxial GaN layer, is improved. Thus, embodiments of the present invention utilize a different number of engineered layers on opposing sides of the polycrystalline ceramic core (note the bonding layer is not considered as an engineered layer in this case), thereby providing benefits not available using only engineered layers that are formed as shells surrounding the polycrystalline ceramic core and overlying layers. One of ordinary skill in the art would recognize many variations, modifications, and alternatives.

In some embodiments, improvements in the quality of the epitaxially grown GaN layer can be achieved by eliminating the conductive layer 414, which the inventors have determined contributes to peeling of the epitaxial GaN layer under some conditions. In these embodiments, the second adhesion layer 416 can be eliminated in addition to the conductive layer 414, resulting in a structure that includes the polycrystalline ceramic core 410, adhesion layer 412, and barrier layer 418 described below. Thus, in these embodiments, the engineered layers include only two layers, the adhesion layer and the barrier layer, which, therefore, results in a structure with only three interfaces: core|adhesion, adhesion|barrier, and barrier|bonding. One of ordinary skill in the art would recognize many variations, modifications, and alternatives.

A barrier layer 418, for example, a silicon nitride layer, is formed surrounding the second adhesion layer 416. In an embodiment, the barrier layer 418 is a silicon nitride layer that is on the order of 4,000 Å to 5,000 Å in thickness. The barrier layer 418 completely surrounds the second adhesion layer 416 in some embodiments to form a fully encapsulated structure and can be formed using an LPCVD process. In addition to silicon nitride layers, amorphous materials including SiCN, SiON, AlN, SiC, and the like can be utilized as barrier layers. In some implementations, the barrier layer consists of a number of sub-layers that are built up to form the barrier layer. Thus, the term barrier layer is not intended to denote a single layer or a single material, but to encompass one or more materials layered in a composite manner. One of ordinary skill in the art would recognize many variations, modifications, and alternatives.

In some embodiments, the barrier layer 414, e.g., a silicon nitride layer, prevents diffusion and/or outgassing of elements present in the polycrystalline ceramic core 410, for example, yttrium oxide (i.e., yttria), oxygen, metallic impurities, other trace elements, and the like into the environment of the semiconductor processing chambers in which the engineered substrate could be present, for example, during a high temperature (e.g., 1,000° C.) epitaxial growth process. Utilizing the encapsulating layers described herein, ceramic materials, including polycrystalline GaN, polycrystalline AlGaN, and polycrystalline AlN with dopants, which may not typically be suitable for use in clean room environments, can be utilized in semiconductor process flows and clean room environments. Additional description related to the use of barrier layers is provided in U.S. Patent Application No. 62/350,084, filed on Jun. 14, 2016, the disclosure of which is hereby incorporated by reference in its entirety for all purposes.

Referring once again to FIG. 4, a bonding layer 420 (e.g., a silicon oxide layer) is deposited on a portion of the barrier layer 418, for example, the top surface of the barrier layer, and subsequently used during the bonding of a substantially single crystal layer 430. The bonding layer 420 can be approximately 1.5 μm in thickness in some embodiments. In some embodiments that include the use this substrate construction for Power or RF devices, the silicon oxide thickness can be reduced substantially (for example, down to ~1000 Å) in order to improve the thermal properties of the substrate.

The substantially single crystal layer 430 is suitable for use as a growth layer during an epitaxial growth process for the formation of a thick GaN epitaxial layer as illustrated in FIGS. 1A through 3B. In an embodiment, the substantially single crystal layer 430 includes a single crystal silicon layer or a single crystal GaN layer that is attached to the bonding layer 420 using a layer transfer process.

In some embodiments, the bonding layer is omitted, with the substantially single crystal layer 430 joined to the barrier layer. One of ordinary skill in the art would recognize many variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. An engineered substrate comprising:
   a support structure comprising:
      a polycrystalline ceramic core;
      an adhesion layer coupled to the polycrystalline ceramic core;
      a conductive layer coupled to the adhesion layer; and
      a barrier layer encapsulating the conductive layer, the adhesion layer, and the polycrystalline ceramic core;
   a bonding layer coupled to the support structure;
   a substantially single crystal layer coupled to the bonding layer; and
   an epitaxial gallium nitride layer coupled to the substantially single crystal layer.

2. The engineered substrate of claim 1 wherein the polycrystalline ceramic core includes polycrystalline gallium nitride.

3. The engineered substrate of claim 2 wherein the substantially single crystal layer comprises a single crystal silicon layer.

4. The engineered substrate of claim 2 wherein the substantially single crystal layer comprises a single crystal gallium nitride layer.

5. The engineered substrate of claim 1 wherein the polycrystalline ceramic core includes polycrystalline aluminum gallium nitride.

6. The engineered substrate of claim 5 wherein the substantially single crystal layer comprises a single crystal silicon layer.

7. The engineered substrate of claim 5 wherein the substantially single crystal layer comprises a single crystal gallium nitride layer.

8. The engineered substrate of claim 1 wherein the polycrystalline ceramic core includes polycrystalline aluminum nitride and one or more dopants.

9. The engineered substrate of claim 8 wherein the substantially single crystal layer comprises at least one of a single crystal silicon layer or a single crystal gallium nitride layer.

10. The engineered substrate of claim 8 wherein the one or more dopants comprises at least one of titanium or titanium nitride.

11. The engineered substrate of claim 1 wherein the adhesion layer comprises a tetraethyl orthosilicate (TEOS) oxide layer encapsulating the ceramic core.

12. The engineered substrate of claim 11 wherein the TEOS oxide layer is about 1,000 Å in thickness.

13. The engineered substrate of claim 1 wherein the barrier layer comprises a silicon nitride layer encapsulating the adhesion layer.

14. The engineered substrate of claim 13 wherein the silicon nitride layer is about 4,000 Å in thickness.

15. The engineered substrate of claim 1 wherein the bonding layer comprises a silicon oxide layer.

16. The engineered substrate of claim 1 wherein the epitaxial gallium nitride layer is characterized by a thickness between 10 μm and 100 μm.

17. The engineered substrate of claim 16 wherein the thickness is between 40 μm and 80 μm.

18. The engineered substrate of claim 1 wherein a difference between a CTE profile of the polycrystalline ceramic core and a CTE profile of the epitaxial gallium nitride layer is less than 0.5 ppm/K for temperatures between 300K and 1400K.

* * * * *